United States Patent
Liu et al.

(10) Patent No.: US 11,482,939 B2
(45) Date of Patent: Oct. 25, 2022

(54) LLC CONVERTER

(71) Applicant: Murata Manufacturing Co., Ltd., Nagaokakyo (JP)

(72) Inventors: Chuipong Liu, Hong Kong (CN); Kwokchoi Lo, Hong Kong (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 279 days.

(21) Appl. No.: 16/843,341

(22) Filed: Apr. 8, 2020

(65) Prior Publication Data
US 2020/0321881 A1    Oct. 8, 2020

(30) Foreign Application Priority Data

Apr. 8, 2019    (CN) .......................... 201910278904.3

(51) Int. Cl.
*H02M 3/335*    (2006.01)
*H03H 7/01*    (2006.01)
*H02M 1/00*    (2006.01)

(52) U.S. Cl.
CPC ...... *H02M 3/33592* (2013.01); *H03H 7/0115* (2013.01); *H02M 1/0058* (2021.05)

(58) Field of Classification Search
CPC ............. H02M 1/0058; H02M 3/3353; H02M 3/33592; H02M 7/44; H02M 7/4815; H03H 7/0115; Y02B 70/10
See application file for complete search history.

(56) References Cited

U.S. PATENT DOCUMENTS

| 10,135,348 | B2* | 11/2018 | Hsiao | H02M 3/33546 |
| 2014/0247626 | A1 | 9/2014 | Lee | |
| 2014/0254203 | A1* | 9/2014 | Dai | H02M 3/01 363/17 |
| 2018/0191168 | A1* | 7/2018 | Banaska | H02M 1/4208 |
| 2019/0319532 | A1* | 10/2019 | Wang | H02M 3/01 |
| 2020/0112244 | A1* | 4/2020 | Chen | H02M 3/3376 |

FOREIGN PATENT DOCUMENTS

| CN | 105553272 | * | 2/2015 | ........ H02M 3/33569 |
| CN | 107968471 | A | | 4/2018 | |
| CN | 109361321 | * | 2/2019 | ........ H02M 3/33584 |
| KR | 101492964 | * | 5/2016 | ........ H02M 3/33584 |

OTHER PUBLICATIONS

Official Communication issued in corresponding European Patent Application No. 20168504.7, dated Aug. 28, 2020.

* cited by examiner

*Primary Examiner* — Matthew V Nguyen
(74) *Attorney, Agent, or Firm* — Keating & Bennett, LLP

(57) ABSTRACT

An LLC converter includes a resonant network including a resonant capacitance element, a resonant inductance element, and an excitation inductance circuit. The excitation inductance circuit includes a capacitance element and an inductance element connected in series. The minimum operating frequency of the LLC converter is higher than the resonant frequency of the capacitance element and the inductance element.

12 Claims, 11 Drawing Sheets

(a)

(b)

LLC CONVERTER

CROSS REFERENCE TO RELATED APPLICATIONS

This application claims the benefit of priority to Chinese Patent Application No. 201910278904.3 filed on Apr. 8, 2019. The entire contents of this application are hereby incorporated herein by reference.

BACKGROUND OF THE INVENTION

1. Field of the Invention

The present invention relates to an LLC converter, and more particularly, to an LLC converter that reduces the excitation current and is capable of providing high gain.

2. Description of the Related Art

With the development of electronic technology, the requirements for power density and converter conversion efficiency have become more stringent with respect to power systems. The LLC (inductance-inductance-capacitance) converter topology is one of the best choices to achieve high power density and high conversion efficiency converters, because the ZVS (zero voltage switch) of the main switch and the ZCS (zero current switch) of the secondary synchronous rectifier can achieve low switching losses.

FIG. 15 is a diagram schematically showing an equivalent circuit of a conventional LLC converter. As shown in FIG. 15, the LLC converter includes a switching power supply S1 and a resonance network which is composed of a resonance inductance element Lr, a resonance capacitance element Cr, and an excitation inductance element Lmag. For the parameter design of the excitation inductance element Lmag, in order to maximize the efficiency of the LLC converter, it is desirable to maximize the excitation inductance in order to minimize the effective current value of the main switch, which is the RMS (root mean square) current, and provide just enough current for ZVS operation. But in fact, in order to meet the holding time requirements and keep the large capacity capacitance low to achieve high power density, a lower excitation inductance is needed to provide sufficient LLC stage gain to handle the large voltage drop in the case of an AC power failure. This inevitably reduces the conversion efficiency of traditional LLC converters during normal operation.

To solve this problem, in the prior art, such as in U.S. Patent Application Publication No. 2014/0247626, a method using an additional inductance element is proposed. The additional inductance element in this method can be controlled to be connected in parallel with the excitation inductance element by a power semiconductor switch such that the equivalent excitation inductance is reduced to increase the gain in the case that the input voltage of the LLC converter drops due to the AC power failure. In this method, the excitation inductance element may be optimized only for nominal operating conditions to obtain the best efficiency, but the method introduces the additional inductance element and the power semiconductor switch, which increases the size and cost of the converter. In addition, in the case of a sudden change in the equivalent excitation inductance, the converter will show a significant change in characteristics, which will significantly affect the output adjustment.

SUMMARY OF THE INVENTION

Preferred embodiments of the present invention provide LLC converters in each of which equivalent excitation inductance can be smoothly changed according to the operating frequency of the converter. In addition, preferred embodiments of the present invention provide LLC converters in each of which the excitation current is reduced and high gain is able to be provided.

An LLC converter according to a preferred embodiment of the present invention includes a resonant network including a resonant capacitance element (Cr), a resonant inductance element (Lr), and an excitation inductance circuit, the excitation inductance circuit including a capacitance element (Cm) and an inductance element (Lm) connected in series, the minimum operating frequency of the LLC converter being higher than the resonant frequency of the capacitance element (Cm) and the inductance element (Lm).

The LLC converter introduces a variable excitation inductance by an excitation inductance circuit, the equivalent excitation inductance of which changes smoothly according to the operating frequency of the converter. Accordingly, it is possible to achieve the best optimization of the conversion efficiency under the nominal operating conditions and a smooth change of the converter characteristics in the case of AC power failure, without an additional control method and a power semiconductor switch. Accordingly, it is possible to provide an LLC converter in which the equivalent excitation inductance can be smoothly changed according to the operating frequency of the converter. In addition, it is possible to provide an LLC converter in which the excitation current is reduced and the high gain is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention describe an excitation inductance circuit (resonant network) to replace the excitation inductance in a traditional LLC converter. The resonant network is designed to operate in the inductance region such that it is used as the excitation inductance in the LLC converter, but its inductance value varies with the operating frequency.

Figure 1:
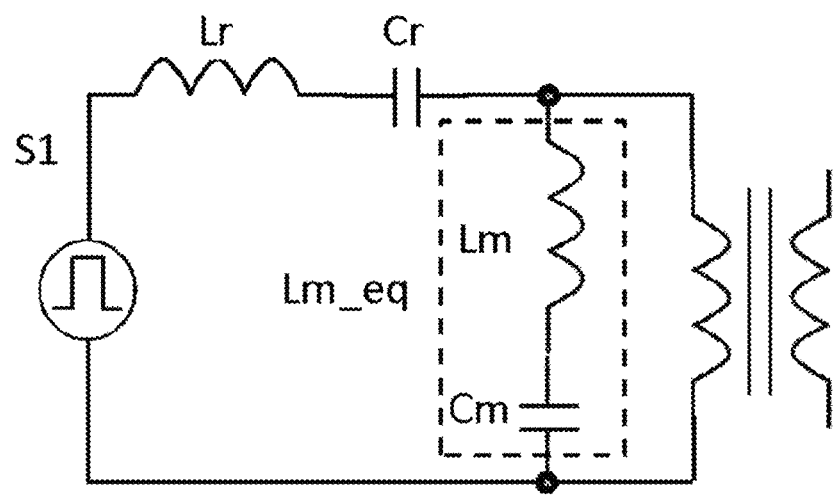
FIG. 1 is a diagram schematically showing an equivalent circuit of an LLC converter according to a preferred embodiment of the present invention.
Figure 15:
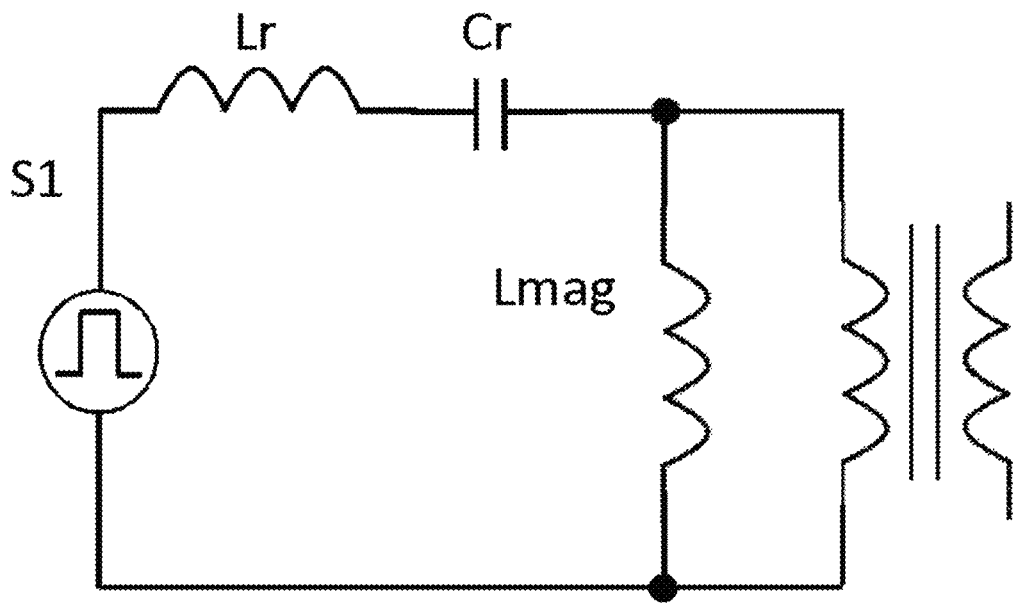
FIG. 15 is a diagram schematically showing an equivalent circuit of a conventional LLC converter.

FIG. 1 is a diagram schematically showing an equivalent circuit of an LLC converter according to a preferred embodiment of the present disclosure. As shown in FIG. 1, in the present preferred embodiment, compared with a conventional LLC converter, for example, compared with the conventional LLC converter shown in FIG. 15, the present preferred embodiment includes a series-connected resonance network (excitation inductance circuit) to replace the excitation inductance element. The resonance network includes an inductance element Lm and a capacitance element Cm, and the resonance network has an equivalent excitation inductance Lm_eq.

Symbol S1 in FIG. 1 is a switching power supply of the LLC converter. In some preferred embodiments of the present invention, it may include a DC input power supply (the voltage of a large capacity capacitance element generated from a power factor correction (PFC) stage) and a half-bridge or full-bridge switching circuit. A resonant inductance element Lr and a resonant capacitance element Cr define a series resonant network of the LLC converter. In the present disclosure, the inductance (hereinafter, sometimes referred to as the symbol Lm) of the inductance element Lm and the capacitance (hereinafter, sometimes referred to as the symbol Cm) of the capacitance element Cm may be determined based on the following two parameters:

1) an expected usual excitation inductance Lm_eq_nom to be used to ensure ZVS turning-on of the switch of the switching power supply S1 during normal working conditions in the case that the voltage of the large capacity capacitance element is at nominal voltage and that the switching frequency is resonant frequency $f_r$ of the resonant inductance element Lr and the resonant capacitance element Cr; and 2) an expected minimum excitation inductance Lm_eq_min to be used to ensure sufficient gain to maintain output stability when the voltage of large capacity capacitance element drops to a targeted minimum and the switching frequency is reduced to the minimum operating frequency $f_{sw\_min}$.

Based on these two parameters, in the case that the resonant network including the inductance element Lm and the capacitance element Cm is provided across the primary winding of the main isolation transformer, the inductance value of the inductance element Lm and the capacitance value of the capacitance element Cm may be calculated according to the following mathematical equation 1 and mathematical equation 2, so as to meet these requirements:

Mathematical Equation 1

$$j\left(2\pi f_r Lm - \frac{1}{2\pi f_r Cm}\right) = j2\pi f_r Lm\_eq\_nom$$

Mathematical Equation 2

$$j\left(2\pi f_{sw\_min} Lm - \frac{1}{2\pi f_{sw\_min} Cm}\right) = j2\pi f_{sw\_min} Lm\_eq\_min.$$

Where j represents an imaginary part, Lm represents an inductance value of the inductance element Lm, and Cm represents a capacitance value of the capacitance element Cm.

Next, the full-bridge LLC converter is described as an example to explain the beneficial technical effects that can be obtained by the present preferred embodiment.

Figure 2:
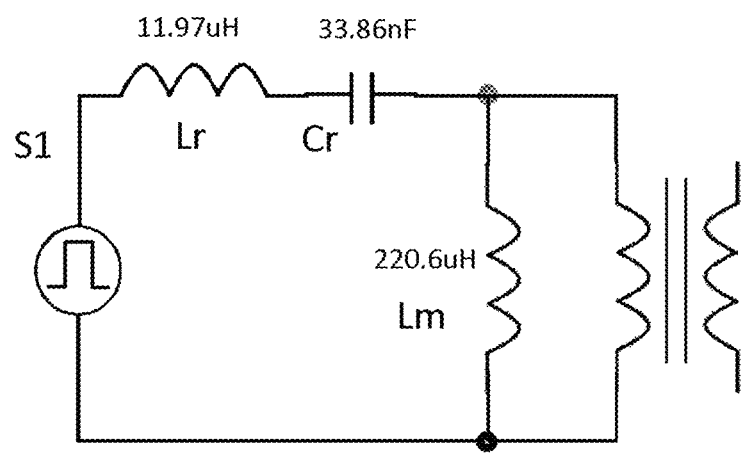
FIG. 2 is a diagram for comparing an example of a preferred embodiment of the present disclosure and a comparative example, where part (a) is a diagram showing a conventional design as a comparative example, and part (b) is an example according to a preferred embodiment of the present disclosure.
Figure 2:
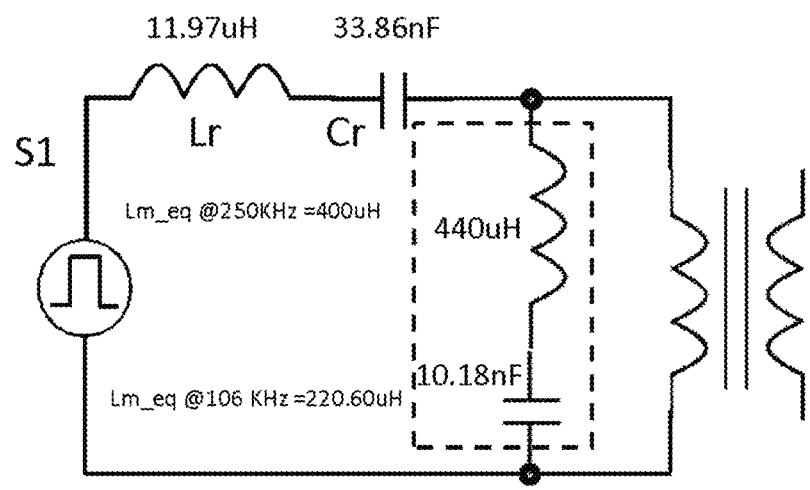

FIG. 2 is a diagram for comparing an example of a preferred embodiment of the present invention and a comparative example, where part (a) is a diagram showing a conventional design as a comparative example, and part (b) is an example according to a preferred embodiment of the present invention. In FIG. 2, the nominal input voltage is set to about 450 V, Lr=about 11.97 μH, Cr=about 33.86 nF, and the resonance frequency is about 250 KHz, and the targeted minimum input voltage is set to about 368 V to meet the holding time requirements. In order to have sufficient gain with the minimum input voltage, the desired excitation inductance is about 220.6 μH with about 3600 W output, where the minimum operating frequency $f_{sw\_min}$=about 106 KHz. Assuming that the desired excitation inductance is about 400 μH under the nominal working conditions, in the present preferred embodiment, the excitation inductance of the LLC converter may be replaced by the resonance network shown in part (b) of FIG. 2.

Figure 3:
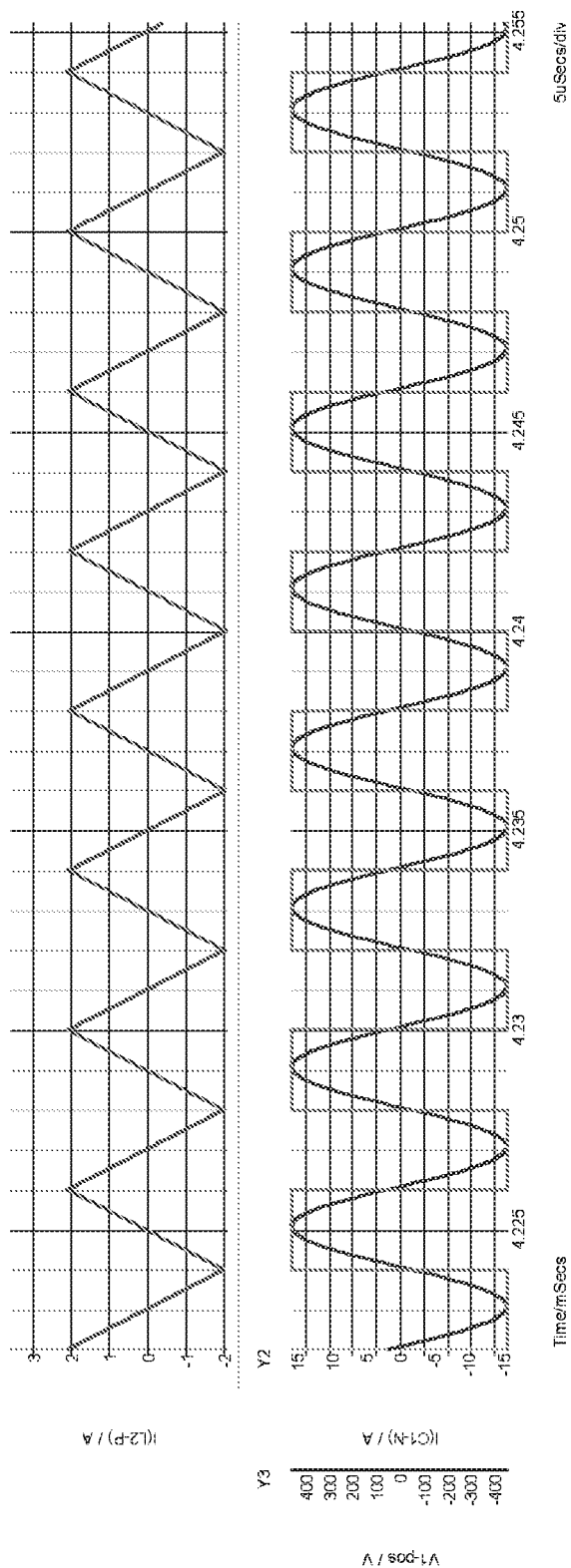
FIG. 3 is a diagram showing a simulation result of part (a) of FIG. 2 under a nominal operating condition.
Figure 4:
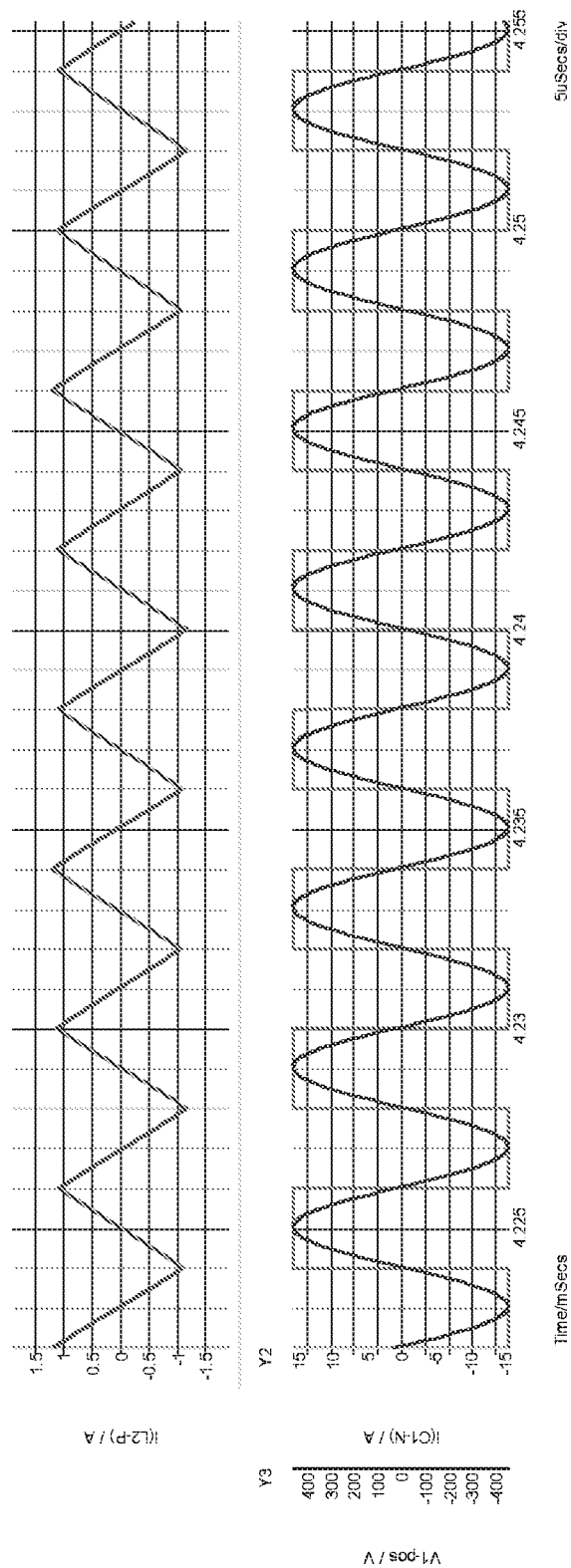
FIG. 4 is a diagram showing a simulation result of part (b) of FIG. 2 under a nominal operating condition.
Figure 5:
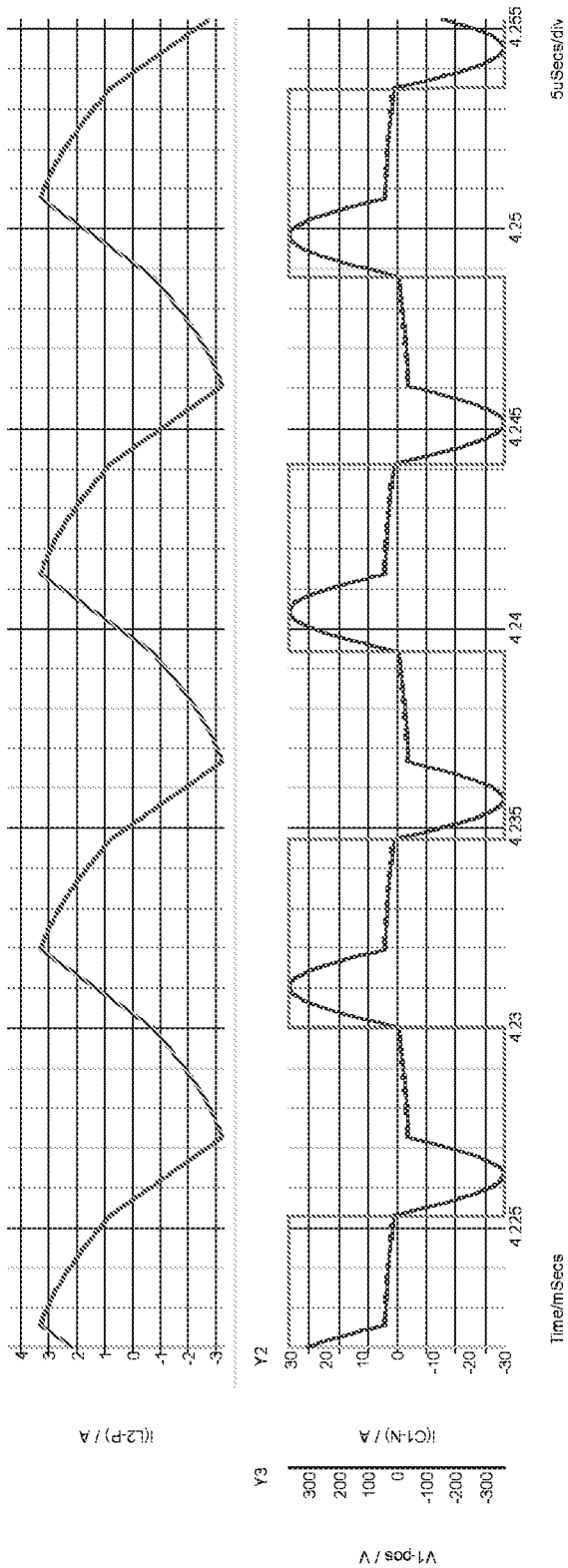
FIG. 5 is a diagram showing a simulation result of part (a) of FIG. 2 when the input voltage is reduced to a minimum value, in which the operating frequency is about 106 KHz.
Figure 6:
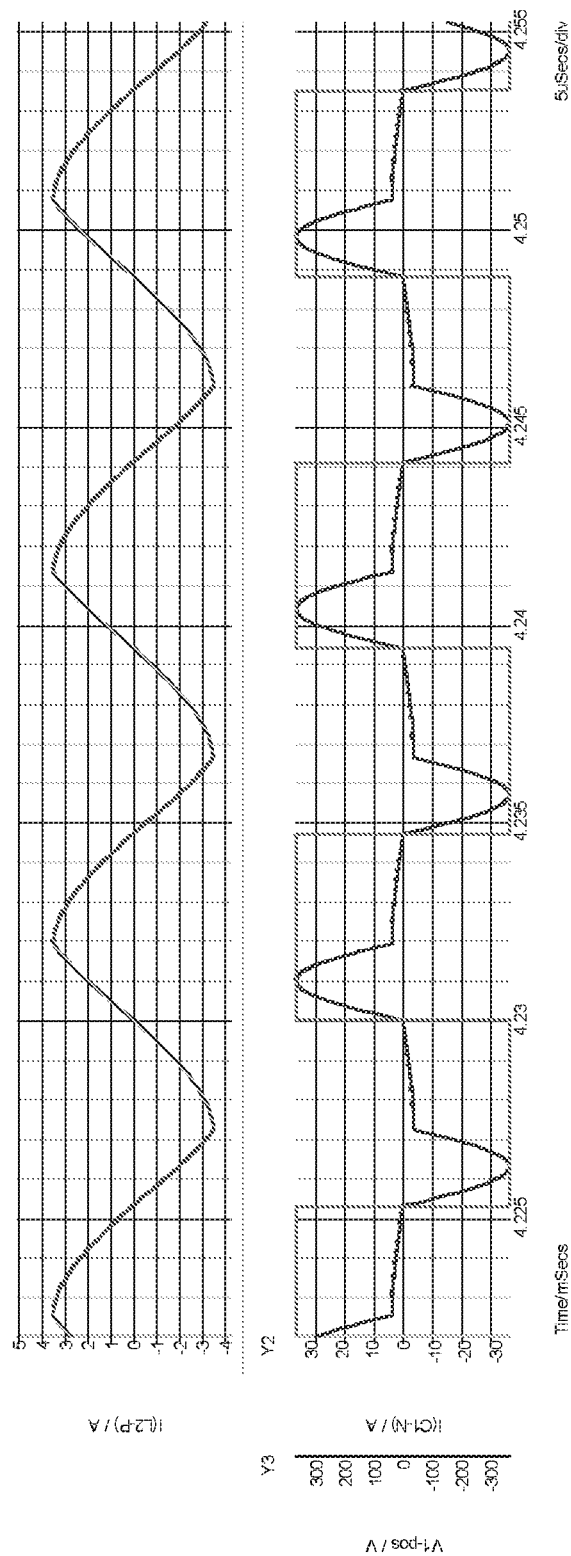
FIG. 6 is a diagram showing a simulation result of part (b) of FIG. 2 when the input voltage is reduced to a minimum value, in which an operating frequency is about 106 KHz.

FIG. 3 to FIG. 6 show the simulation waveforms of the two circuits shown in part (a) and part (b) of FIG. 2 operated at full power output under a nominal operating condition and a minimum input voltage. FIG. 3 is a diagram showing a simulation result of part (a) of FIG. 2 under a nominal operating condition. FIG. 4 is a diagram showing a simulation result of part (b) of FIG. 2 under a nominal operating condition. FIG. 5 is a diagram showing a simulation result of part (a) of FIG. 2 when the input voltage is reduced to a minimum value, in which the operating frequency is about 106 KHz. FIG. 6 is a diagram showing a simulation result of part (b) of FIG. 2 when the input voltage is reduced to a minimum value, in which the operating frequency is about 106 KHz.

In FIG. 3, I_Lm represents a current flowing through the excitation inductance element Lm, V_S1 represents a voltage of the switching power supply S1, and I_Lr represents a current flowing through the resonance inductance element Lr, in which the horizontal axis is time. In FIG. 4, I_Lm_eq represents a current flowing through a resonance network Lm_eq including an inductance element and a capacitance element, V_S1 represents a voltage of the switching power supply S1, I_Lr represents a current flowing through the resonant inductance element Lr, in which the horizontal axis is time. Comparing the current waveforms flowing through the excitation inductance element Lm and the resonance network Lm_eq shown in FIG. 3 and FIG. 4, respectively, it can be observed that the current value drops significantly to almost half in the present preferred embodiment under the nominal operating conditions.

FIG. 5 and FIG. 6 show the simulation waveforms of the circuits of part (a) of FIG. 2 and part (b) of FIG. 2 operated at full power output with the minimum input voltage, respectively. Similarly, in FIG. 5, I_Lm represents the current flowing through the excitation inductance element Lm, V_S1 represents the voltage of the switching power supply S1, I_Lr represents the current flowing through the resonant inductance element Lr, in which the horizontal axis is time. In FIG. 6, I_Lm_eq represents the current flowing through the resonant network Lm_eq including the inductance element and the capacitance element, V_S1 represents the voltage of the switching power supply S1, I_Lr represents the current flowing through the resonant inductance element Lr, in which the horizontal axis is time. Comparing the simulation results shown in FIG. 5 and FIG. 6, it can be observed that both of the present preferred embodiment and the comparative example provide similar improving effects and output power.

From the above comparison between the present preferred embodiment and the comparative example, it is clear that, compared with the conventional LLC converter with a fixed excitation inductance element, the present preferred embodiment reduces the operating current during normal operation (nominal operating conditions), and when the operating frequency of the converter is reduced to adjust the output voltage in the case that the input voltage drops, the equivalent excitation inductance Lm_eq can be smoothly reduced to a low value, which can improve the conversion efficiency of the LLC converter and ensure sufficient gain when the voltage drops, such that the holding time requirements are met without the large capacity capacitance element.

As described above, the present preferred embodiment replaces the excitation inductance Lmag in the conventional LLC converter with a series resonance circuit including an inductance Lm and a capacitance Cm. When the operating frequency of the LLC converter is higher than the resonant frequency of the inductance Lm and the capacitance Cm, the resonant circuit including the inductance Lm and the capacitance Cm is used as an inductance element, where the equivalent inductance Lm_eq of the inductance element varies with the operating frequency of the converter, having higher inductance at higher operating frequencies and having lower inductance at lower operating frequencies. By properly selecting the values of the inductance Lm and the capacitance Cm, the equivalent inductance Lm_eq can maintain high inductance during normal operation when the operating frequency of the converter is around the resonant frequency $f_r$ of the resonant inductance Lr and the resonant capacitance Cr, and the equivalent inductance Lm_eq can be reduced to a low value when the operating frequency of the converter is reduced to adjust the output voltage in the case that the input voltage drops. Compared with conventional LLC converters with fixed excitation inductance, the characteristics of the equivalent inductance Lm_eq are able to obtain the higher equivalent inductance value under normal operating conditions when the converter frequency is close to $f_r$, such that the excitation current is reduced and the conversion efficiency of the LLC converter is improved, and can also provide proper low inductance when the converter is under low operation frequency in the case that the input voltage drops, to ensure sufficient gain to adjust the output voltage such that the holding time requirements is met without the large capacity capacitance element.

The present invention is not limited to the above-described preferred embodiments. According to actual requirements, the inductance characteristics of the resonant network can be used to replace the excitation inductance of the conventional LLC converter with different driving configurations. For example, with respect to the inductance element Lm and the capacitance element Cm defining the resonance network, although only one is shown in FIG. 1, this is to facilitate understanding of preferred embodiments of the present invention. Those skilled in the art can understand that, for example, the inductance element Lm may include a plurality of inductance elements and the capacitance element Cm may include a plurality of capacitance elements, and those skilled in the art can make various modifications and changes.

In addition, the resonance network Lm_eq may be located at any winding of the transformer of the LLC converter, as long as the turns ratio is able to achieve the desired function.

Figure 7:
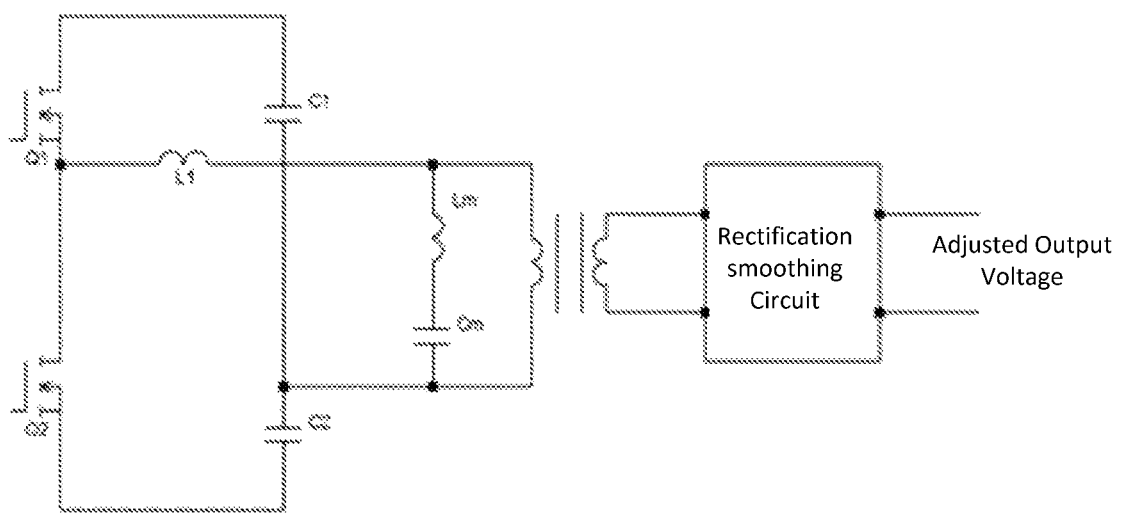
FIG. 7 is a diagram showing another example of a preferred embodiment of the present invention.

FIG. 7 is a diagram showing another example of a preferred embodiment of the present invention. FIG. 7 shows an example of a half-bridge LLC converter in which an inductance element L1, a capacitance element C1, and a capacitance element C2 define an LLC series resonance circuit. A resonance network including an inductance element Lm and a capacitance element Cm is provided across the primary winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 8:
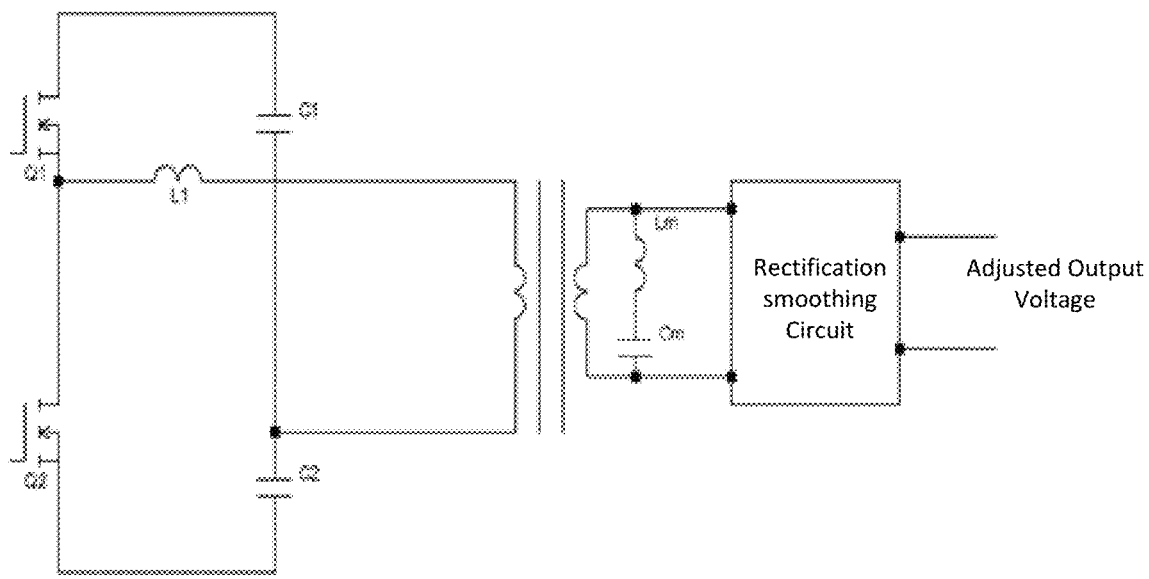
FIG. 8 is a diagram showing another example of a preferred embodiment of the present invention.

FIG. 8 is a diagram showing another example of a preferred embodiment of the present invention. FIG. 8 shows an example of a half-bridge LLC converter in which an inductance element L1, a capacitance element C1, and a capacitance element C2 define an LLC series resonance circuit. A resonance network including an inductance element Lm and a capacitance element Cm is provided across the secondary output winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 9:
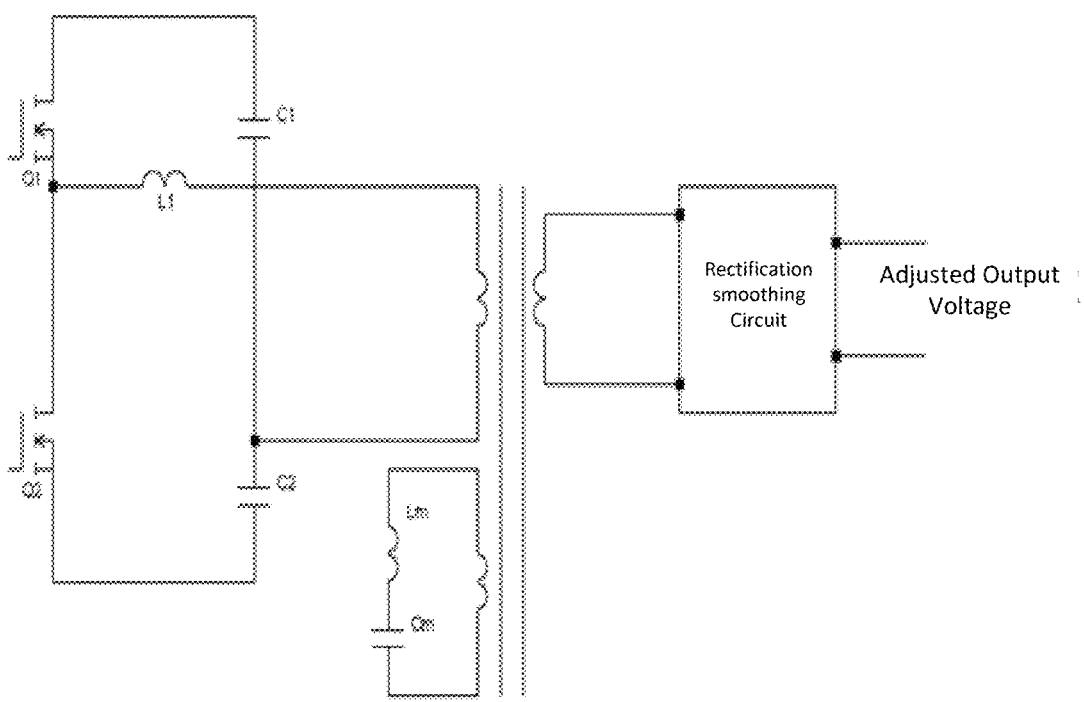
FIG. 9 is a diagram showing another example of a preferred embodiment of the present invention.

FIG. 9 is a diagram showing another example of a preferred embodiment of the present invention. FIG. 9 shows an example of a half-bridge LLC converter in which an inductance element L1, a capacitance element C1, and a capacitance element C2 define an LLC series resonance circuit. A resonance network including an inductance element Lm and a capacitance element Cm is provided across the additional primary winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 10:
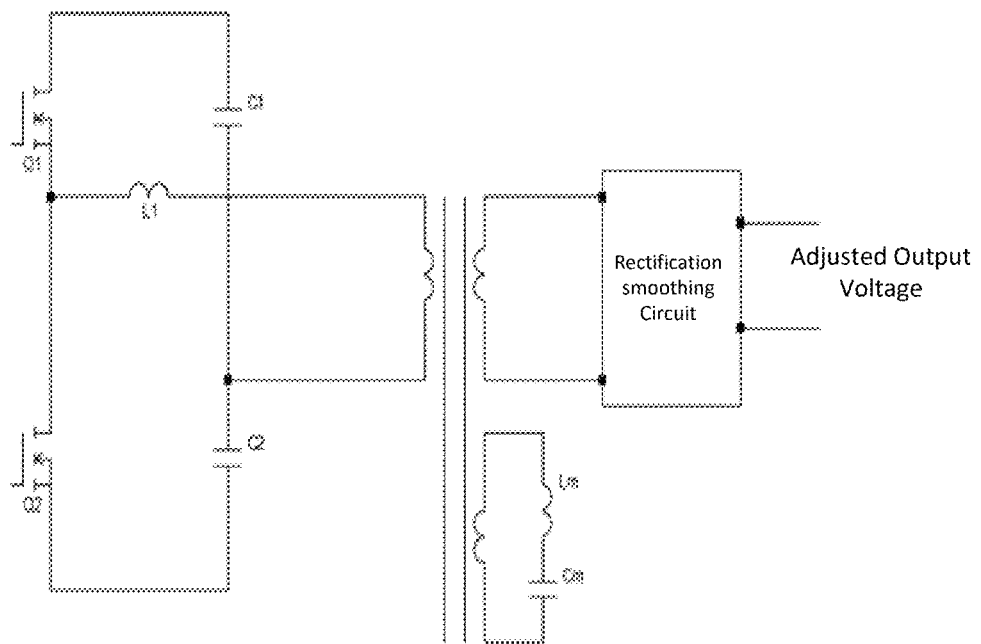
FIG. 10 is a diagram showing another example of a preferred embodiment of the present invention.

FIG. 10 is a diagram showing another example of a preferred embodiment of the present invention. FIG. 10 shows an example of a half-bridge LLC converter in which an inductance element L1, a capacitance element C1, and a capacitance element C2 define an LLC series resonance circuit. A resonance network including an inductance element Lm and a capacitance element Cm is provided across the additional secondary winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 11:
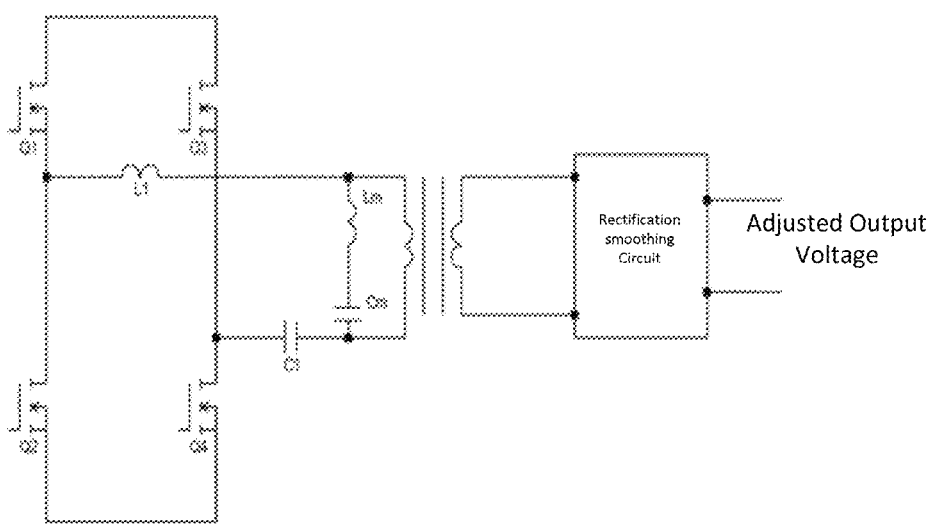
FIG. 11 is a diagram showing another example of a preferred embodiment of the present invention.

FIG. 11 is a diagram showing another example of a preferred embodiment of the present invention. FIG. 11 shows an example of a full-bridge LLC converter in which an inductance element L1 and a capacitance element C1 define an LLC series resonance circuit. A resonance network including an inductance element Lm and a capacitance element Cm is provided across the primary winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 12:
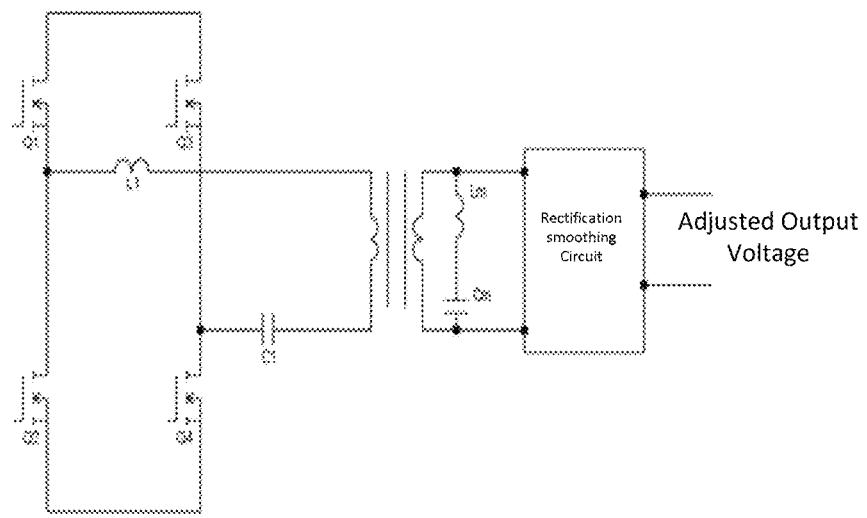
FIG. 12 is a diagram showing another example of a preferred embodiment of the present invention.

FIG. 12 is a diagram showing another example of a preferred embodiment of the present invention. FIG. 12 shows an example of a full-bridge LLC converter in which an inductance element L1 and a capacitance element C1 define an LLC series resonance circuit. A resonance network including an inductance element Lm and a capacitance element Cm is provided across the secondary output winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 13:
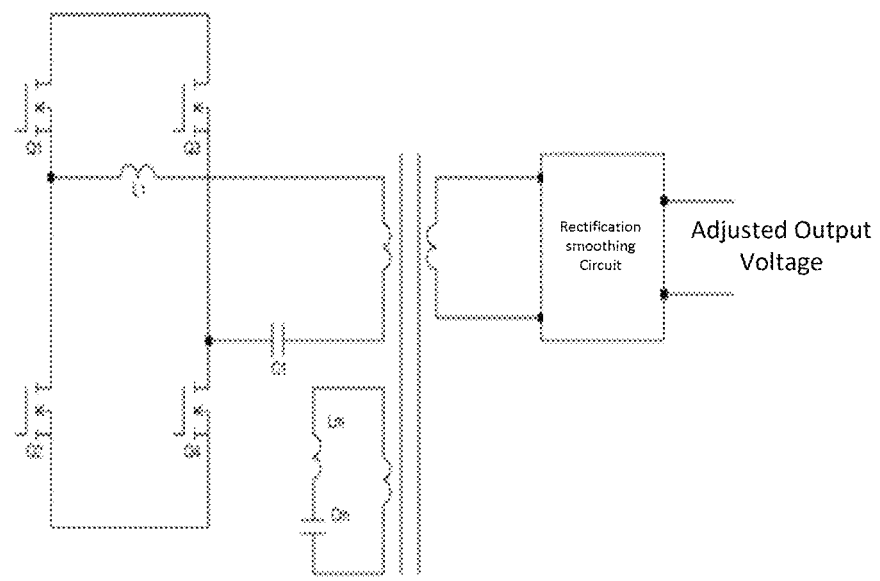
FIG. 13 is a diagram showing another example of a preferred embodiment of the present invention.

FIG. 13 is a diagram showing another example of a preferred embodiment of the present invention. FIG. 13 shows an example of a full-bridge LLC converter in which an inductance element L1 and a capacitance element C1 define an LLC series resonance circuit. A resonance network including an inductance element Lm and a capacitance element Cm is provided across the additional primary winding of the main isolation transformer to replace the conventional excitation inductance. The secondary winding of the main isolation transformer is coupled to a rectification smoothing circuit to produce the required DC output. According to this design, the rectifier circuit may be, for example, a full-wave or bridge rectifier diode or a synchronous rectifier, and the like.

Figure 14:
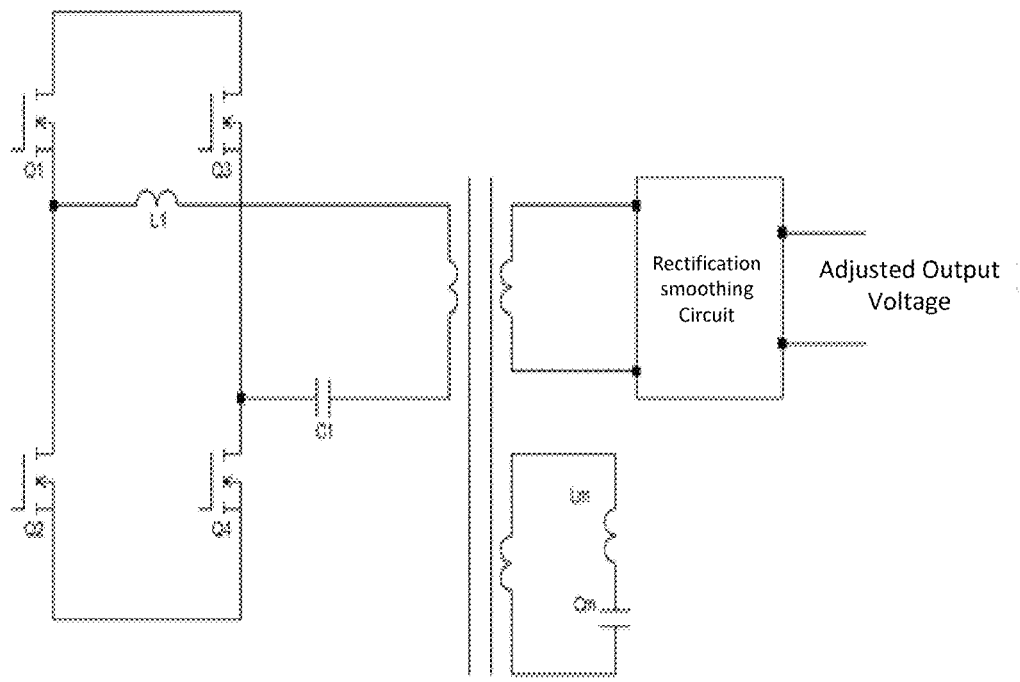
FIG. 14 is a diagram showing another example of a preferred embodiment of the present invention.

FIG. 14 is a diagram showing another example of a preferred embodiment of the present invention. FIG. 14 shows an example of a full-bridge LLC converter in which an inductance element L1 and a capacitance element C1 define an LLC series resonance circuit. A resonance network including an inductance element Lm and a capacitance element Cm is provided across the additional secondary winding of the main isolation transformer to replace the conventional excitation inductance. The secondary winding of the main isolation transformer is coupled to a rectification and smoothing circuit to produce the required DC output. According to this design, the rectifier circuit may be, for example, a full-wave or bridge rectifier diode or a synchronous rectifier, and the like.

As described above, in the case that the resonance network including the inductance element Lm and the capacitance element Cm is provided across the primary winding of the main isolation transformer, the inductance value of the inductance element Lm and the capacitance value of the capacitance element Cm are calculated using the above-described mathematical equation 1 and mathematical equation 2. In the case where the resonance network including the inductance element Lm and the capacitance element Cm is not provided at the primary winding of the main isolation transformer, as long as the multiple of the number of turns of the primary winding of the main isolation transformer is set to "N" with respect to the number of turns of primary winding at which the resonance network including the inductance element Lm and the capacitance element Cm is located, when the inductance value Lm' and the capacitance value Cm' are calculated by using the above-described mathematical equation 1 and mathematical equation 2, the following mathematical equation 3 and mathematical equation 4 may be used to calculate the inductance value of the inductance element Lm and the capacitance value of the capacitance element Cm:

$$Lm = Lm'/N^2 \quad \text{Mathematical equation 3}$$

$$Cm = Cm'*N^2. \quad \text{Mathematical equation 4}$$

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LLC converter comprising:
   a resonant network including a resonant capacitance element, a resonant inductance element, and an excitation inductance circuit; and
   a main isolation transformer; wherein
   the excitation inductance circuit includes a capacitance element and an inductance element connected in series;
   a minimum operating frequency of the LLC converter is higher than a resonant frequency of the capacitance element and the inductance element of the excitation inductance circuit;
   the excitation inductance circuit is provided across a primary winding of the main isolation transformer, a secondary output winding of the main isolation transformer, an additional primary winding of the main isolation transformer, or an additional secondary winding of the main isolation transformer; and
   denoting Cm as a capacitance value of the capacitance element, Lm as an inductance value of the inductance element, Lm eq nom as a normal excitation inductance expected for the excitation inductance circuit, Lm eq min as a minimum excitation inductance expected for the excitation inductance circuit, $f_r$ as a resonance frequency of the resonance inductance element and the resonance capacitance element, and $f_{sw\_min}$ as a minimum operating frequency of the LLC converter, in a case that the excitation inductance circuit is provided across the primary winding of the main isolation transformer, the capacitance value of the capacitance element and the inductance value of the inductance element satisfy following relationships:

$$j\left(2\pi f_r Lm - \frac{1}{2\pi f_r Cm}\right) = j2\pi f_r \text{Lm\_eq\_nom, and}$$

$$j\left(2\pi f_{sw\_min} Lm - \frac{1}{2\pi f_{sw\_min} Cm}\right) = j2\pi f_{sw\_min} \text{Lm\_eq\_min.}$$

2. The LLC converter according to claim 1, wherein the LLC converter is a half-bridge LLC converter or a full-bridge LLC converter.

3. The LLC converter according to claim 1, wherein the excitation inductance circuit is provided across the primary winding of the main isolation transformer.

4. The LLC converter according to claim 2, wherein the LLC converter is a half-bridge LLC converter.

5. The LLC converter according to claim 2, wherein the LLC converter is a full-bridge LLC converter.

6. An LLC converter comprising:
a resonant network including a resonant capacitance element, a resonant inductance element, and an excitation inductance circuit; and
a main isolation transformer; wherein
the excitation inductance circuit includes a capacitance element and an inductance element connected in series;
a minimum operating frequency of the LLC converter is higher than a resonant frequency of the capacitance element and the inductance element of the excitation inductance circuit;
the excitation inductance circuit is provided across a primary winding of the main isolation transformer, a secondary output winding of the main isolation transformer, an additional primary winding of the main isolation transformer, or an additional secondary winding of the main isolation transformer; and
denoting Cm as a capacitance value of the capacitance element, Lm as an inductance value of the inductance element, Lm_eq_nom as a normal excitation inductance expected for the excitation inductance circuit, Lm_eq_min as a minimum excitation inductance expected for the excitation inductance circuit, $f_r$ as a resonance frequency of the resonance inductance element and the resonance capacitance element, and $f_{sw\_min}$ as a minimum operating frequency of the LLC converter, in a case that the excitation inductance circuit is provided across the secondary output winding of the main isolation transformer, the additional primary winding of the main isolation transformer, or the additional secondary winding of the main isolation transformer, the capacitance value of the capacitance element and the inductance value of the inductance element satisfy following relationships:

$$j\left(2\pi f_r Lm' - \frac{1}{2\pi f_r Cm'}\right) = j2\pi f_r \text{Lm\_eq\_nom},$$

$$j\left(2\pi f_{sw\_min} Lm' - \frac{1}{2\pi f_{sw\_min} Cm'}\right) = j2\pi f_{sw\_min} \text{Lm\_eq\_min},$$

$$Lm = \frac{Lm'}{N^2}, \text{ and}$$

$$Cm = Cm' \times N^2$$

wherein Lm' represents an inductance value, Cm' represents a capacitance value, and N represents a multiple of a number of turns of the primary winding of the main isolation transformer with respect to a number of turns of a winding across which the excitation inductance circuit is provided.

7. The LLC converter according to claim 6, wherein the excitation inductance circuit is provided across the secondary output winding of the main isolation transformer.

8. The LLC converter according to claim 6, wherein the excitation inductance circuit is provided across the additional primary winding of the main isolation transformer.

9. The LLC converter according to claim 6, wherein the excitation inductance circuit is provided across the additional secondary winding of the main isolation transformer.

10. The LLC converter according to claim 6, wherein the LLC converter is a half-bridge LLC converter or a full-bridge LLC converter.

11. The LLC converter according to claim 10, wherein the LLC converter is a half-bridge LLC converter.

12. The LLC converter according to claim 10, wherein the LLC converter is a full-bridge LLC converter.

* * * * *